United States Patent [19]

Watt

[11] 4,001,682
[45] Jan. 4, 1977

[54] AMBIGUITY FREE DIGITAL AVERAGING PHASE METER

[75] Inventor: Richard E. Watt, San Diego, Calif.

[73] Assignee: Cubic Corporation, San Diego, Calif.

[22] Filed: Dec. 18, 1974

[21] Appl. No.: 530,691

Related U.S. Application Data

[63] Continuation-in-part of Ser. No. 293,107, Sept. 28, 1972, abandoned.

[52] U.S. Cl. .............................. 324/83 D; 328/155
[51] Int. Cl.² ........................................ G01R 25/00
[58] Field of Search ............ 324/83 D, 83 A, 83 R, 324/82; 307/232, 210, 221 R; 328/134, 141, 155

[56] References Cited

UNITED STATES PATENTS

| 3,629,715 | 12/1971 | Brown | 328/155 |
|---|---|---|---|
| 3,764,903 | 10/1973 | Griswold | 324/83 D |

OTHER PUBLICATIONS

K. A. Steele, *Application of Digital Integrated Circuits to Linear Phase Detection*, Elec. Eng., May 1968.

*Primary Examiner*—Palmer C. Demeo
*Assistant Examiner*—Michael J. Tokar
*Attorney, Agent, or Firm*—Kleinberg, Morganstern, Scholnick & Mann

[57] ABSTRACT

The inherent phase ambiguity that results from the measurement of the phase difference between a reference signal and a data signal having a zero phase relationship is eliminated by adding 360° to phase differences between 0° and 180°. Phase differences between 180° and 360° are measured in the conventional manner. Both the reference signal and the data signal are divided in frequency and the phase difference between the divided signals are compared. The data signal is inhibited for only 180° of the original reference signal to prevent an initial comparing of phase differences between the data signal and the reference signals to establish the proper polarity relationship between the half rate data signal and the half rate reference signal.

8 Claims, 5 Drawing Figures

AMBIGUITY FREE DIGITAL AVERAGING PHASE METER

This application is a continuation in part of a prior application filed by the same inventor Richard E. Watt on Sept. 28, 1972 and given Ser. No. 293,107, now abandoned. This invention relates to digital averaging phase meters and, more particularly, to a system for eliminating the ambiguities that exist in an averaging meter when measuring the phase between data and reference signals having a phase difference close to zero.

The phase between two corresponding signals may be defined as the time or distance between corresponding portions of two different signals having the same frequency. The phase difference between a pair of sine waves having the same frequency can be measured between corresponding portions when the individual sine wave crosses the zero axis. By considering either the square waves or sine waves having the same frequency, the phase can usually be measured between corresponding portions where the individual waves cross the zero axis.

For example, the distance between the positive transition of the first wave crossing the zero axis and the positive transition of the second wave crossing the zero axis is a measure of the phase difference between the two waves. The measured distance is usually measured in degrees. However, in a digital system utilizing timing impulses, the distance can be measured in terms of discrete pulses generated by a suitable clock generator.

It is well known that the phase difference between a pair of corresponding signals may be measured either by the time interval between corresponding positive transitions of the two signals or by measuring the interval between corresponding negative transitions of the two signals. Since both signals are usually symmetrical both readings should be the same. In a copending application entitled, ASYMMETRICAL WAVE DIGITAL PHASE MEASURING SYSTEM of the same inventor and assigned to the same assignee, a phase measuring system is disclosed in which the individual signals are not symmetrical. The teachings of the referenced patent application may be used in the present patent application, should the measured signals be found not symmetrical.

Phase measuring systems have found wide applicability in both navigation systems and distance measuring systems employing CW electromagnetic signals. The so-called Loran navigation system transmits a pair of accurately located signals, in which the measured phase or time difference between the signals is an indication of present locations on the Earth. A navigator receives and detects the pair of signals and by means of suitable digital phase measuring equipment, accurately measures the phase or time between the pair of signals as an indication of his location on the face of the Earth. Accurate phase measuring equipment is, therefore, necessary to determine precise location.

Distance and Angle measuring systems continuously compare the phase of a transmitted CW signal with a phase of a received CW signal. The phase difference is then representative of the distance (or direction cosine) between the object and the point of transmission. Typical measuring systems utilizing digital phase meters are described and claimed in U.S. Pat. Nos. 3,078,460 and 3,300,780 which are assigned to the assignee of the present invention.

In continuous wave digital ranging systems, it is the common practice to take repetitive readings over a period of time in order to normalize the total reading and reduce the effect of external signals that may be generated as a result of noise or other outside phenomena.

The problem solved by the present invention is created by objects that are located at a distance substantially equal to one-half the wave length of the signal being propagated. In such a situation, the "round trip" phase difference between the transmitted wave and the received waves should be substantially zero.

The problem is best illustrated in the following example. Assume a clock generator that generates one thousand pulses for each 360° of phase of the signal. If the target is located one-half wave length away from the transmitter, one thousand pulses of the clock generator will be stored between zero crossings of the transmitted and received waves. If the measurement is repeated one hundred times, in a perfect system, 100,000 pulses will be generated and dividing 100,000 by 100 results in an answer of 1,000 pulses, which is equivalent to 360° phase difference between the transmitted and received wave.

Unfortunately, in the real world, noise and other outside considerations cause a "jittering" of the received signal. Since conventional digital phase meters start and stop a counter by corresponding portions of the reference and data signals, it is possible, depending on jitter and other considerations, for a "race" to exist between the stopping of the counter by the data signal and the starting of the counter by the very next reference signal.

Considering a system which averages one hundred readings, it can be assumed that for 50 of these readings, the "stop" pulses came "early" and for 50 readings, the "stop" pulses came "late." This situation will result in the counter receiving very few pulses (1 to 5) for 50 readings and a very large number of pulses (995 – 999) for fifty readings. The total of the two will equal a total count of 50,000 pulses, which is equivalent to 180°, which clearly does not represent the 360° phase difference that was assumed.

The error at the 0° phase difference between the reference and data signals is peculiar to the digital phase meter and results directly from the jittering or "race" that develops between the starting and stopping of the counter.

The prior art devices have not seen fit to solve the problem, but rather simply create a "dead" zone around the 0° phase difference and prevent readings from taking place during this critical time. This, of course, has the effect of degrading the total readings of the complete system since the total count is always changed and never represents a true and accurate reading. In addition, it is most desirous to take a repetitive number of readings in order to obtain the benefits of averaging out the short term noise transients that invariably exist whenever signals are radiated into space.

In the present invention, the ambiguity existing between the data signal and the reference signal having 0° phase difference is resolved by first dividing the data signal and the reference signal and then inhibiting the data signal for only the first 180° of the phase of the reference signal. This action has the effect of causing any phase difference between 0° and 180° to be resolved between 360° and 540°. At the same time any phase difference existing between 180° and 360° is not affected but is read in a conventional manner. Inhibiting the data signal for only the first 180° of the reference signal insures that a 0° phase difference will not be measured until 360° later.

The novel features which are believed to be characteristic of the invention, both as to organization and method of operation, together with further objects and advantages thereof will be better understood from the following description considered in connection with the accompanying drawings in which several preferred embodiments of the invention are illustrated by way of example. It is to be expressly understood, however, that the drawings are for the purpose of illustration and description only and are not intended as a definition of the limits of the invention.

Further objects and advantages of the present invention will be made more apparent by referring now to the accompanying drawings, wherein.

Figure 1:
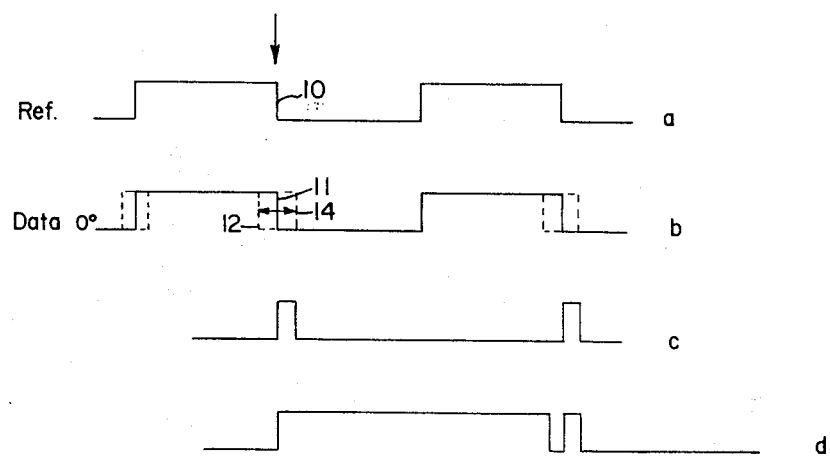
FIG. 1 is a schematic drawing illustrating the ambiguity when the data and reference signals are in phase.

Referring now to FIG. 1, there is shown a series of wave forms which illustrates the ambiguity that results when the data and reference signals are "in phase". Curve (a) illustrates a reference signal square wave at a given frequency and Curve (b) illustrates a data signal square wave at the same frequency and in phase with the reference signal. If we assume a convention whereby negative going signals trigger the counter we can show that the negative transition 10 of the reference wave (a) will turn a counter ON whereas the corresponding negative transition 11 of the data wave (b) will attempt to turn the counter OFF. The problem resulting from the fact that external noise will cause jittering of the incoming data signal is that the exact location of the negative transition point 11 on the data signal (b) will not always be simultaneous with the reference transition 10, but may be an "earlier" transition or a "later" transition 14. In a system which averages a hundred readings, it would be expected that for fifty of those readings the earlier transition 12 will occur and for fifty, the later transition 14 will occur.

Should the later transition 14 of the data signal occur in time, then the counter will be turned on for a very brief period as shown by Curve (c).

For the other 50 readings, it may be expected that the earlier transition 12 will occur. The counter will be turned on as shown in Curve (d) and will not be turned off again until approximately one cycle later. The counter associated with the conventional digital phase detector will therefore be energized into an ON position for 50 measurements as shown by Curve (c) and for 50 measurements as shown by Curve (d). If we assume that Curve (d) allows at least one pulse to be counted, and that Curve (d) allows approximately 999 pulses to be counted, it can be shown that for the 100 measurements 50 thousand pulses will be accumulated. Having already assumed a clock frequency where 1,000 pulses equals 360°, it is apparent that a count of 50,000 pulses for 100 measurements or 500 pulses per measurement indicates a phase difference of 180°, which is an obvious error.

It will be noted, however, that the ambiguity only exists when the data signal is in a substantially in-phase condition with the reference signal, since the time coincidence between the negative transition 10 of the reference CW signal and the negative transition 11 of the data signal is virtually simultaneous. Hence, a "race" develops in the presence of "noisy" signals. A review of FIG. 1 will show that the same situation would exist regardless of whether the positive transitions or the negative transitions are used to control the counter circuit.

The above described ambiguities are prevented according to the present invention by insuring that measurements are never taken about the 0° point in the event of a 0° phase difference between a data signal and a reference signal. In the preferred embodiment, the reference and data signals are divided by two in separate flip-flop circuits. This allows the phase to be measured over a 720° interval relative to the initial signals. In other words, all measurements are "forced" to be taken over phase relationships between 180° and 540°, since phase differences of 0° to 180° added to them. Phase differences of between 180° and 360° need not have 360° added to them. The counting process of the phase meter is such that if 360° of phase is added to the phase difference being measured, the counter will cycle through 0 during the measuring process, and the remaining number will represent the true phase.

Figure 2:
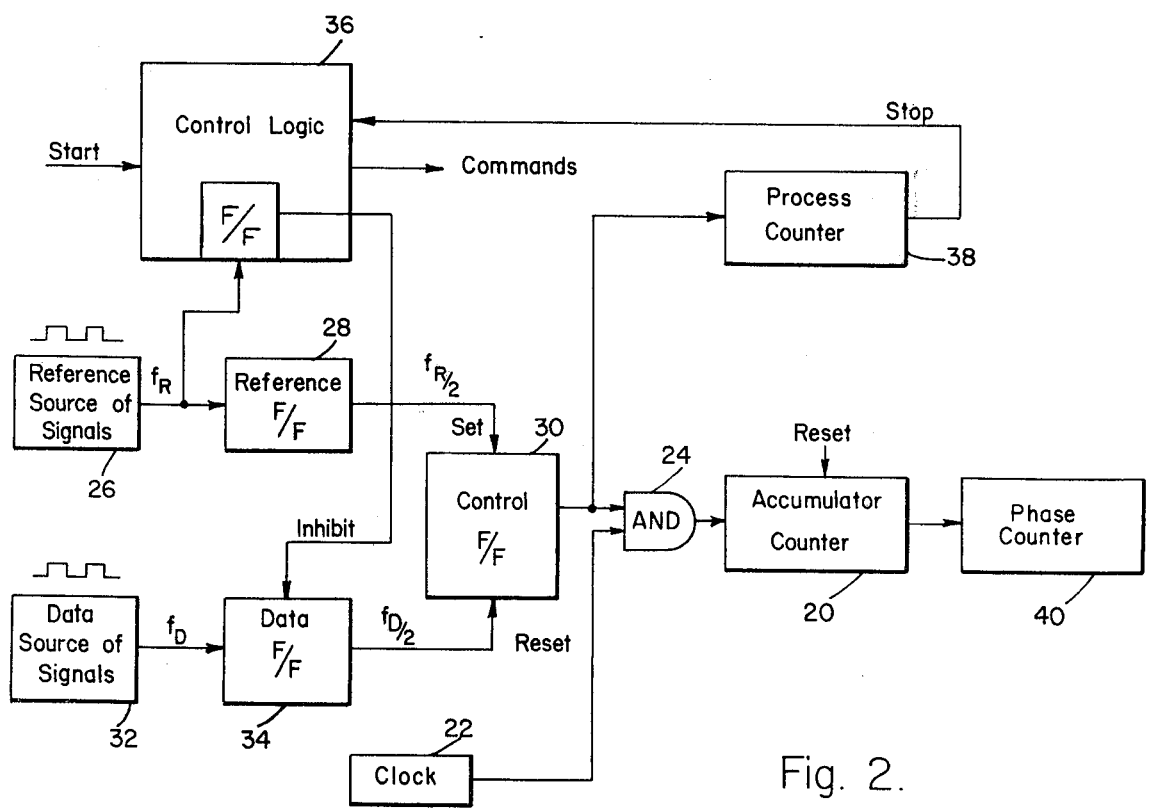
FIG. 2 is a block diagram illustrating a preferred embodiment of the present invention for eliminating the 0° phase ambiguity.

Referring now to FIG. 2, there is shown a block diagram comprising an accumulator counter 20 and phase counter 40, adapted to receive pulses from a clock generator 22 through "and" gate 24. A source 26 of reference signals $f_R$ generated locally is fed to a reference flip-flop circuit 28 for dividing the original source reference signal in half to produce an output $f_{R/2}$ which is fed to the set input of control flip-flop 30. The setting of flip-flop 30 enables "and" gate 24 to accumulator counter 20 and allows the clock pulse from the clock 22 to be accumulated in counter 20 and counter 40.

In a similar manner a source 32 of data signals $f_D$, usually received from some external means such as returned signals from a ranging CW system as previously described, has the same frequency as the source 26 of reference signals $f_R$ is fed to a data flip-flop 34 which divides the frequency of the data signals in half to produce an output $f_{D/2}$. The output of the data flip-flop 34 is fed to the reset input of control flip-flop 30, for disabling "and" gate 24, and stopping the accumulation of clock pulses from the clock generator 22. A digital phase meter is normally used in conjunction with other equipment and, hence, a Control Logic circuit 36, responsive to external commands, is used to control the functions of the digital phase meter in response to these external controls.

The proper phase relationship of the data signal is achieved by inhibiting the very first negative going pulse in the data signal from generating or causing the generation of a reset pulse from the flip-flop 34. The inhibiting signal is generated from the Reference source 26 which feeds the same negative going signal to the flip-flop 28 and to the Control logic 36, which produces an output inhibit to the Data flip-flop 34, for a predetermined time interval (180°) thereby preventing the generation of a negative going pulse in response to a data input during that interval. This inhibiting pulse from the control logic 36 occurs only once in a complete measurement sequence of readings to obtain a given average and occurs only during the first 0° to 180° interval of the reference signal $f_R$. Since the preferred system requires an averaging of 100 readings, a single inhibiting pulse will be generated only during the first 180° of the reference signal $f_R$.

It is clear from the above description that during the measuring period, whose beginning is identified by the appearance of the signal Start, the inhibit flip flop (shown in FIG. 2) in control logic block 36 is first turned on at the beginning of the 180° period by the first negative going transition of reference signal $f_R$ and is then turned off again at the end of the 180° period as identified by the next positive transition of signal $f_R$ - an output signal of the inhibit flip flop serving during this 180° period or interval as the required inhibit signal.

With such recognition of the functioning of control logic 36 and of its inhibit flip flop, it is a routine matter to write logic for a suitable circuit embodiment of control logic block 36, as described herebelow:

Since the inhibit flip flop is to be operated in the described manner only after the Start signal has arrived, an additional flip flop will be required in control logic block 36 to identify that the Start signal has previously arrived. For purposes of convenience, let us refer to the inhibit flip flop as the A flip-flop and the second flip-flop which signals the appearance of the Start signal as the B flip flop. As is conventional, we will assume that initially the A and B flip flops are both cleared or reset to their zero states. We can then immediately write a truth table or sequence of states of the A and B flip flops which conforms to the description provided in the specification so as to produce the required operations of the inhibit flip flop and its production of the required Inhibit signal. Such truth table is provided immediately below:

TRUTH TABLE 1

|  | Inhibit F/F A | Start F/F B |
|---|---|---|
|  | 0 | 0 |
| Start |  |  |
|  | 0 | 1 |
| $f_R$ |  |  |
|  | 1 | 1 |
| $f_{R\prime}$ |  |  |
|  | 0 | 0 |
| Stop |  |  |
|  | 0 | 0 |

It is seen, referring to the truth table, that initially the inhibit flip flop A and the start indicating flip flop B are both in their 0 states. In response to the Start signal, the flip flop B is set to a 1 state to thereby indicate that the Start signal has previously arrived. Thereafter, in response to the first negative going transition of the reference signal $f_R$, the flip flop A is set to a 1 state to thereby indicate the beginning of the 180° period. At the end of the 180° period as evidenced by the next positive going transition of the reference signal $f_R$, the A flip flop is reset to its 0 state to thereby mark the termination of the described 180° period, and the B flip flop is also reset to its 0 state to thereby again return both flip flops to their 00 starting states. The flip flops have thereby completed one cycle of operation, and will begin another cycle only upon the next appearance of the signal Start at the beginning of the next measuring period. This insures that the inhibit flip flop A will be in its 1 representing state for the first 180° following the appearance of the signal Start.

As an additional precaution, even though the A and B flip flops have been returned to their 00 starting states by the first positive going transition of reference signal $f_R$, the Stop signal can be additionally used to reset or zero the flip flops A and B so as to insure the flip flops being initially in the proper starting states.

Figure 3:
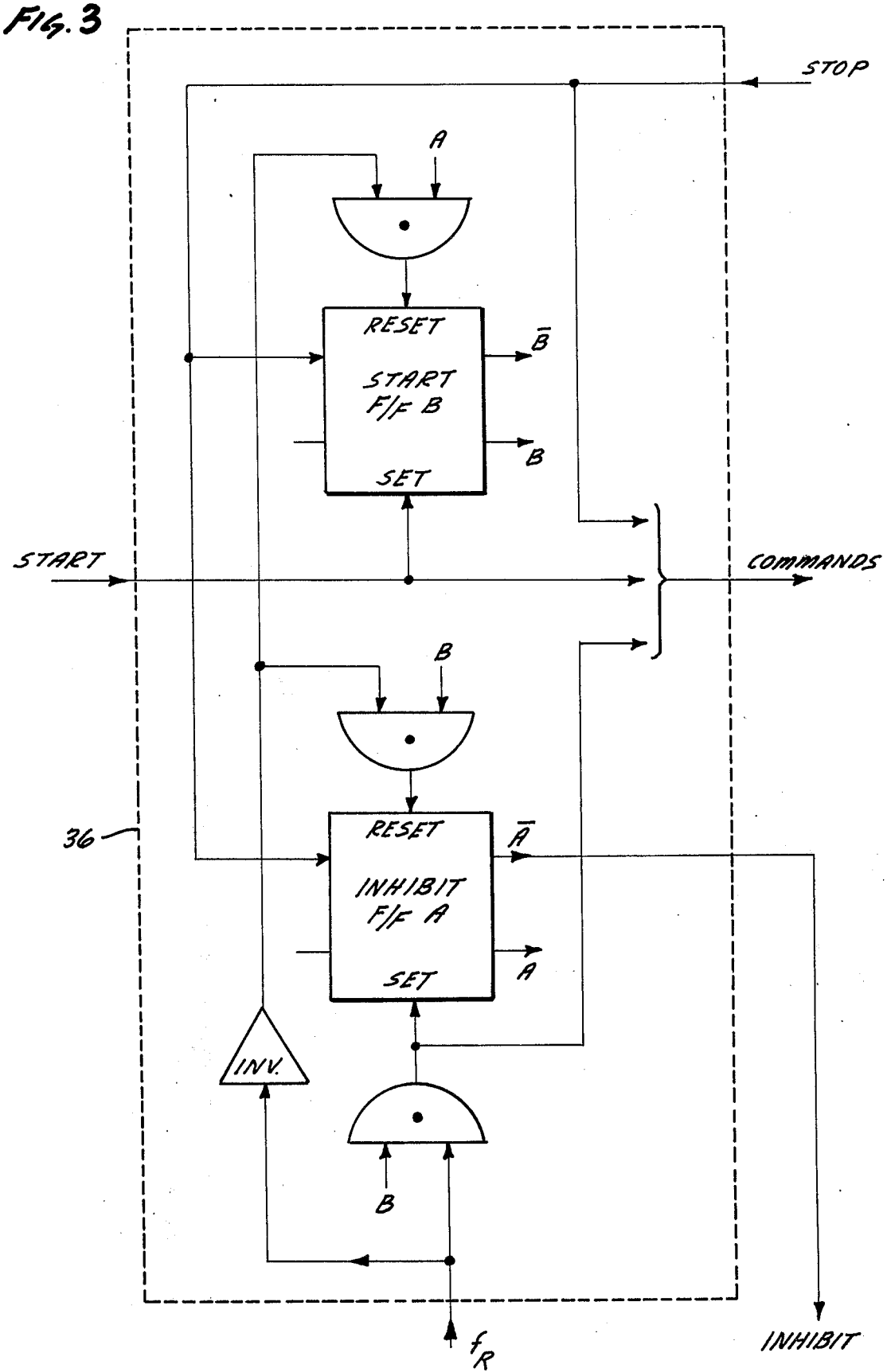
FIG. 3 is a block diagram showing how the control logic is implemented in the preferred embodiment.

From the truth table, suitable circuit logic can be directly written by simple inspection as follows:

Set A = B . $f_R$
Reset A = B . $f_{R\prime}$ + Stop
Set B = Start
Reset B = A . $f_{R\prime}$ + Stop
$\bar{A}$ = Inhibit These logic equations for the setting and resetting of the flip flops directly define and describe the structure of a suitable detailed circuit embodiment of control logic block 36. A drawing of the defined circuit embodiment is shown in FIG. 3.

It is seen that in conformance with the description in the specification, the $f_R$ signal is applied to set the inhibit flip flop and that the complementary output signal $\bar{A}$ of the inhibit flip flop is utilized as the required Inhibit signal. The $f_R$ signal is also applied, inverted by a suitable inverting amplifier, to reset the inhibit flip flop with the next occurring positive transition of the reference signal $f_R$. The Stop signal may be utilized, if desired, to insure resetting the A and B flip flops to their initial states at the end of a measurement sequence although, as indicated, such resetting by the signal Stop will not ordinarily be required. The Start signal, the Set A signal and the Stop signal may be utilized, if desired, as commands to respectively order the resetting, enabling, and disenabling of the remainder of the system during a measurement period.

It is seen that there is nothing unique about the particular circuit embodiment of control logic block 36 which has been developed hereabove. As is well known in the digital art, given the description of the input and output functions of control logic block 36 which is provided in the specification, anyone skilled in the digital art can rapidly generate literally hundreds of different circuit embodiments of control logic 36, all of which satisfy the requirements set forth in the specification. It is clear from the foregoing that development of detailed circuit embodiments of control logic block 36 is routine and that such circuits may be readily developed, by anyone skilled in the art, from the detailed description provided in the present specification.

One such alternative embodiment of the control logic will now be discussed. It is clear from the consideration of the above discussion and in the light of FIG. 2 that the inhibit signal will still operate satisfactorily if it is formed to extend in time from the arrival of the Start through the first 180° of the reference signal, i.e., from the Start signal through the first negative transition of $f_R$ to the next following positive transition of $f_R$.

An embodiment of control logic block 36 having such an extended inhibit signal can be readily mechanized in the manner before-described. Again, a truth table showing the states of the A and B flip-flops can be written, which is arranged to produce the required operations of the inhibit flip-flop and its production of the required extended inhibit signal. Such a truth table would appear as follows:

TRUTH TABLE 2

|  | Inhibit F/F A | Start F/F B |
|---|---|---|
| Start | 0 | 0 |
|  | 1 | 0 |
| $f_R$ |  |  |
|  | 1 | 1 |
| $f_{R+}$ |  |  |
|  | 0 | 1 |
| Stop |  |  |
|  | 0 | 0 |

As indicated in the truth table 2, in this embodiment the inhibit flip flop A is set on receipt of the Start signal. The inhibit flip flop A is reset upon the next succeeding positive transition of $f_R$ following the first negative transition. Thus, flip flop A inhibits the signals from data flip flop 34 from the arrival of the Start signal until the first positive transition of $f_R$ following its first negative transition; i.e. from Start through the first full 180° of $f_R$ as measured between successive negative and positive transitions thereof. Similarly flip-flop B is set at the first negative transition of $f_R$ and then reset by the stop signal. It can be seen referring to truth table 2, that signal B (of flip flop B) defines at its 1 level a time interval, which begins with the first negative transition of $f_R$ and continues until the stop signal has been received, thus defining the same time interval which is demarked by the command signals (Set A and Stop) of the embodiment of FIG. 3, so that signal B can be utilized if desired as a command signal to order the enabling of the remainder of the system during a measurement period. The start and stop signals may also be utilized as before as additional reset commands.

From the truth table, suitable circuit logic equations can be written by inspection as follows:

Set A = Start
Reset A = B . $f_{R+}$
Set B = A . $f_{R-}$
Reset B = Stop.
Inhibit = A $$\text{Commands} = \begin{cases} B \\ \text{Start} \\ \text{Stop} \end{cases}$$

Figure 4:
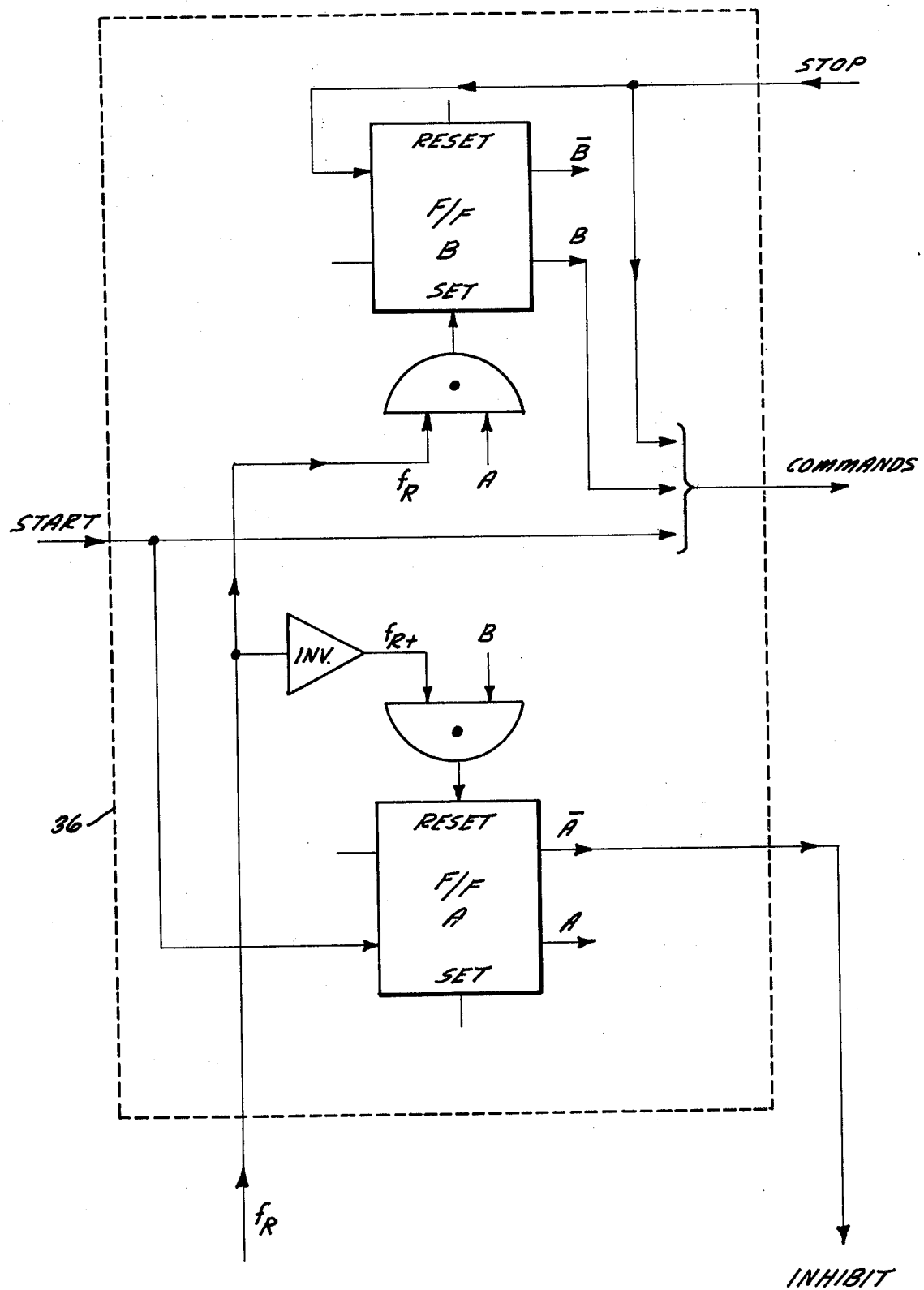
FIG. 4 is a block diagram showing how the control logic may be implemented in an alternate embodiment.

These logic equations for setting and resetting of the flip flops directly define and describe the structure of a suitable detailed circuit embodiment of control logic block 36. A drawing of the defined circuit embodiment is shown in FIG. 4. The start, stop, and $f_R$ inputs will be recognized from FIG. 2 where they are shown entering the control logic block 36. Likewise, the inhibit signal and the other commands, including measure enable, are shown leaving the control logic block 36.

FIG. 4 shows that flip flop A is set by the start pulse and flip flop B is set by the combined presence of signal A and a clocking pulse provided by the first negative transition of $f_R$. Signal $F_r$ is also applied, inverted by an amplifier to flip flop A so that the positive transition $F_{r+}$ of $f_R$ can serve as a clocking pulse, which is anded with signal B to reset flip flop A. As shown, the stop signal resets flip flop B. The A output signal of flip flop A may be utilized as the required inhibit signal. As indicated signals Start, Stop and B may be utilized as command signals to order the resetting and enabling and disenabling of the remainder of the system during a measurement period.

Returning now to continue the description of the first embodiment, it should be pointed out that the number of average readings selected for a given operation is preset and is a function of external considerations. The output of the control flip-flop 30 feeds a Process Counter 38 which actually counts the number of times that the accumulator counter 20 is turned ON by the output of the Control flip-flop 30 and, hence, each pulse is an indication of one complete measurement. The process counter 38 for the example given will generate a "stop" signal when 100 counts are reached. The "stop" signal is fed to the control logic 36.

The actual information contained in accumulator counter 20 and phase counter 40 is the total number of pulses generated by the clock generator 22 during each interval that the counters were permitted to operate and hence is only an indication of pulse count and not directly readable as degrees. The individual parameters are within the discretion of the designer. For example, if the resolution of measurement required is one part in a thousand and the reference and data frequency is 10,000 Hz, then the required clock frequency will be one thousand times 10 Khz or 10Mhz. In other words, the clock generator 22 will be generating 1000 pulses for every cycle of the signal at the selected frequency. For ever 360° therefore, the counters will count 1000 pulses. Similarly, if the phase difference was 180° the counters would read 500 pulses for a cycle. The phase counter 40 fed by the accumulator counter 20 is used to accumulate the output of counter 20. The count capacity of the accumulator counter 20 is equal to the capacity of the process counter 38 and the count capacity of the phase counter 40 equals the phase resolution of the system which, for the assumed system, is 1000.

Figure 5:
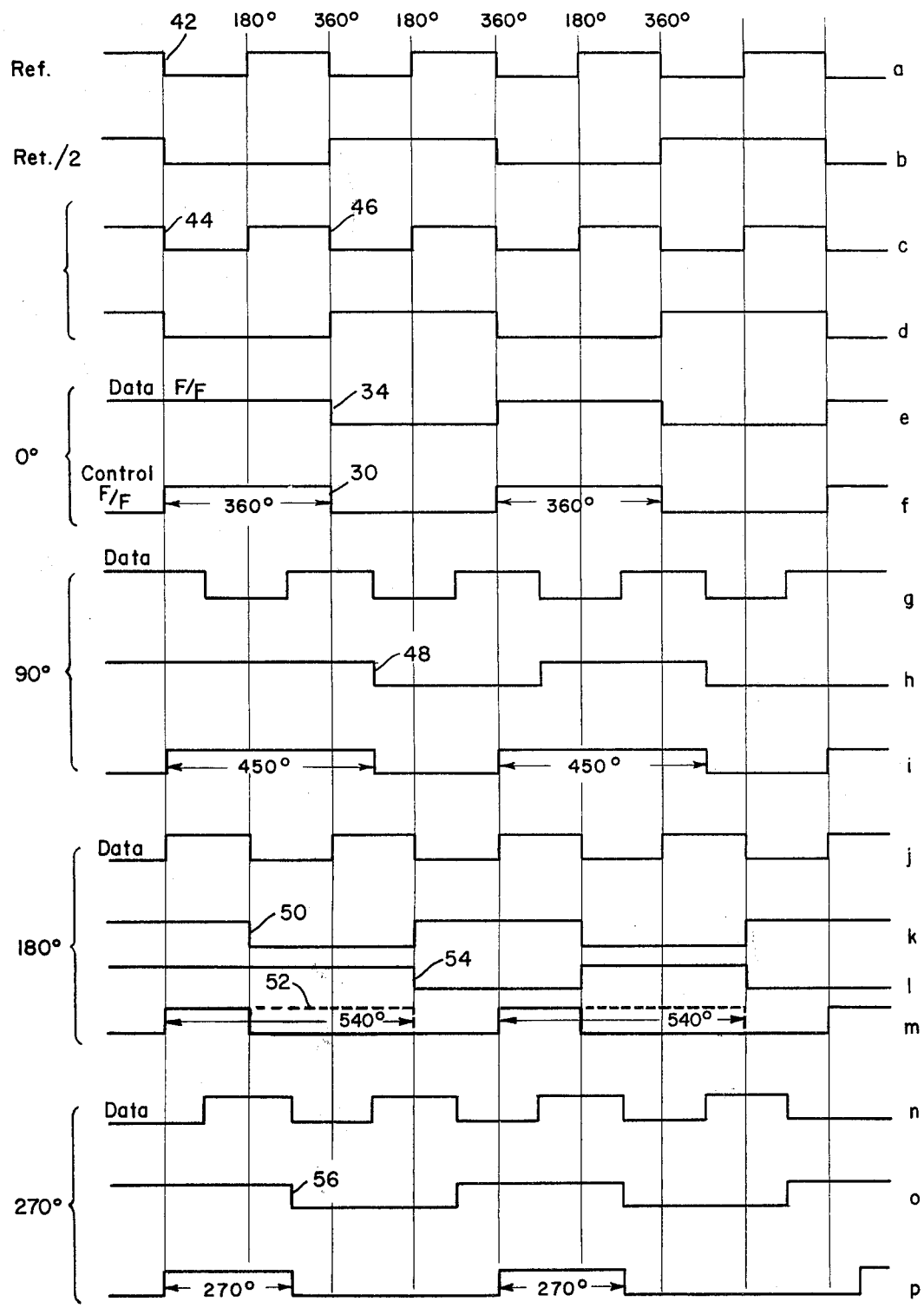
FIG. 5 is a series of wave form diagrams illustrating the operation of the system of FIG. 2 for the 0°, 90°, 180° and 270° differences between data and reference signals.

Referring now to FIG. 5, there is shown a series of wave forms which more fully illustrate the operation of the system illustrated in FIG. 2. Curve (a) represents the reference wave having a certain periodic function as generated by the source 26 of reference signals. Curve (b) illustrates the dividing by 2 of the reference signal, as generated by the output of the flip-flop circuit 28. The first negative going transition 42 of the reference signal not only feeds reference flip-flop 28, but also feeds a flip-flop associated with the control logic 36, for generating the inhibiting pulse that inhibits the data flip-flop 34 in a set condition for the first 180°.

Curves (c), (d), (e) and (f) of FIG. 5 illustrate the situation of 0° phase difference between a data signal and reference signal. For example, the data signal shown in (c) is in-phase with the reference signal shown in (a). In the absence of an inhibiting pulse $f_{D/2}$ signal would be generated as shown in (d) at the output of the data flip-flop 34. However, since the first negative transition 42 of the reference as shown in (a) inhibits the flip-flop 34, it will be observed, as shown in (e) that nothing happens for the first 180°.

The first Data signal negative transition 44 has no effect on the Data flip-flop 34 in view of the inhibiting pulse from the control logic 36. It is not until the next Data signal negative transition 46 which is at a point in time after the removal of the inhibiting pulse, that Data flip-flop 34 is reset. The negative transition 46 of the data signal as shown in (c) is the actual starting point for the $f_{D/2}$ signal which is fed to the Control flip-flop 30. This process continues for the complete set of readings as determined by the process counter 38 and control logic 36.

A review of the control flip-flop 30 will show that the reference signal negative transition 42 via $f_{R/2}$ turns the control flip-flop 30 ON as indicated by Curve (f) whereas the Data signal negative transition 46 via $f_{D/2}$ as shown in (e) turns the Control flip-flop 30 OFF.

A review of Curve (f) will show that the control flip-flop 30 and hence the accumulator counter 20 and phase counter 40 have been ON for 360° and has therefore accumulated 1000 pulses. If for any reason jitter or other external considerations has caused, say a ± 1 counter variation in the timing of the data signal negative transition 46, it can be appreciated that the total accumulation will, therefore, vary between 999 and 1001 which is approximately 0° phase. Hence, the average between the two will certainly be substantially 0°, which is the proper reading. The ambiguity previously mentioned has therefore been eliminated by insuring that during conditions of 0° phase difference between data and reference signals, that readings are never taken at the zero crossing point.

Referring now to Curves (g), (h) and (i), there is illustrated the situation that exists when the data signal (g) is 90° out of phase with the reference signal (a). The inhibiting pulse as mentioned previously is generated and will prevent any negative transition of the data signal during the first 180° of the reference signal from affecting the control flip-flop 30.

However, a review of Curve (g) will show that the first negative going pulse does not occur until 90° after reference transition 42 (same as $f_{R/2}$) thus the inhibiting pulse generated by the reference signal inhibits Data flip-flop 34 until the second negative data transition of Curve (g). A review of Curve (i) will show that the control flip-flop 30 is turned ON by the first negative transition 42 of the reference signal as in (a) and is not turned OFF until the first negative transition of the data $f_{D/2}$ signal, as at transition 48 in Curve (h).

The time that control flip-flop 30 is ON is measured from transition 42 in the reference of Curve (a) to the transition 48 when $f_{D/2}$ signal has a negative transition (as shown at (h)). The total elapsed phase is, therefore, 450° which is equivalent to 360° plus 90°. The total count accumulated in the counter will, therefore, be 1000 + 250 or 1250 pulses. The carry in the "thousand" position is lost, and only 250 is retained in the phase counter 40. For 100 such measurements, counter 20 will read 00 and counter 40 will read 250, which is equal to 90°.

A review of Curves (j), (k) and (l) will show the situation for a 180° difference between the reference signal as at (a) and the data signal as at (j). The $f_{D/2}$ signal generated by the output of flip-flop 34 will occur about 180° after the negative transition 42 of the reference signal. The inhibiting signal will last for 180° and, hence, it is a question of timing as to whether the negative transition of the data (Curve j) will produce the $f_{D/2}$ signal as shown in (k) or (l) with a starting transition at 50 or 54, respectively. Should the negative transition 50 occur after the end of the inhibiting pulse, then the control flip-flop 30 will be turned OFF, as shown in Curve (m). The control flip-flop 30 will be ON for 180 inches and the counters will accumulate 500 pulses.

If we assume for purposes of explanation that because of timing, the negative data transition (Curve j) occurs at a point earlier than the end of the inhibiting pulse, then the $f_{D/2}$ starting transition will be as shown in Curve (1) and the control flip-flop 30 will not be turned OFF but will continue ON as shown by the dotted line 52, until the starting negative transition 54 of the $f_{D/2}$ signal, which will then reset control flip-flop 30.

A review of Curve (m) will show that in this last situation, the counters have been ON from transition 42 of the reference signal as shown in (a) until transition 54 as shown in Curve (m) representing a total time of 180° plus 360° for a grand total of 540° (1,500 counts). Since the counter recycles to 0 after each 1000 counts, the remaining contents of the counter represent a reading of 180° (500 counts). After 100 such measurements, phase counter 40 will read 500, which represents 180°.

A review of Curves (n), (o) and (p) illustrate the situation for a phase difference of 270° between the reference signal of Curve (a) and the data signal of Curve (n). As mentioned previously, the inhibiting pulse prevents any negative transition of the data signal from starting the $f_{D/2}$ signal flip-flop 34 during the first 180° of the reference signal. A review of Curve (o) will show that the first negative data transition will produce a starting $f_{D/2}$ transition 56 which is beyond the inhibiting period of 180°. Hence the Control flip-flop 30 will be turned OFF as shown in Curve (p). A review of Curve (p) will show that the control flip-flop 30 and, hence, the counters have been turned ON from transition 42 on curve (a) to point 56 as measured by the negative transition of $f_{D/2}$ data signal as shown in Curve (o). The number stored in the phase counter 40 after 100 measurements, will therefore be 750 which is equivalent to 270°, as indicated above.

What is claimed is:

1. A digital system for measuring the phase difference between corresponding transitions of applied first and second signals having substantially the same frequency and for eliminating the phase measurement ambiguities that exist when corresponding transitions thereof are nearly coincident, said digital system comprising:

means for dividing the frequency of the applied first signal and the frequency of the applied second signal each by the same amount to produce respectively corresponding first and second output signals each having a corresponding lower frequency;

means for receiving the first and second output signals and measuring the phase difference between corresponding transitions of said divided first output signal and said divided second output signal; and means responsive to said first signal and coupled to said means for dividing for inhibiting the production of said second output signal for the first 180° of phase of said first signal, whereby phase differences less than 180° have 360° added thereto; and wherein said means for measuring the phase difference comprise:

a counter;

a pulse generator selectively connected to said counter; and control means coupled to receive said divided first and second output signals and operable in response thereto for enabling and disabling the provision of said pulse generator output to said counter, respectively.

2. A system according to claim 1 which includes means connected to said counter for indicating the phase difference between said first and second signal as a function of the number of clock pulses accumulated in said counter during the interval of operation.

3. A system according to claim 1 in which said means for dividing include
a first circuit fed by said first signal for generating said first output signal at half the input frequency, and a second circuit fed by said second signal for generating said second output signal at half the input frequency.

4. A system according to claim 3 which includes means responsive to said first signal for inhibiting said second circuit for the first 180° of said first signal.

5. A system according to claim 3 further including a controllable switching circuit in which said first output signal of said first circuit and said second output signal of said second circuit are applied to said controllable switching circuit for indicating the phase difference between said first and second signals.

6. A system according to claim 5 which includes means connected to said counter for indicating the phase difference between said first and second signal as a function of the clock pulses in said counter.

7. In combination:
a reference source of repetitive signals having a given frequency,
a data source of repetitive signals having substantially the said given frequency,
first means responsive to said reference signals for dividing said reference signal by two,
second means responsive to said data signal for dividing said data signal by two,
a clock generator selectively gated to an accumulating counter,
gating means controlled by similar portions of said divided reference signal and said divided data signals for selectively controlling the pulses fed by said clock generator to said counter,
means, coupled to said reference source and said second means, for inhibiting said data signal from affecting said gating means during the first 180° of phase of said original reference signal, and
means for indicating the phase difference between said original reference signal and said original data signal as a function of the clock pulses transmitted to said accumulating counter.

8. A digital system for measuring the phase difference between corresponding transitions of applied first and second signals having substantially the same frequency and for eliminating the phase measurement ambiguities that exist when corresponding transitions thereof are nearly coincident, said digital system comprising:
means for dividing the frequency of the applied first signal and the frequency of the applied second signal each by the same amount to produce respectively corresponding first and second output signals each having a corresponding lower frequency,
means for receiving the first and second output signals and measuring the phase difference between corresponding transitions of said divided first output signal and said divided second output signal over a predetermined plurality of successive cycles of said output signals, said means including apparatus for accumulating all the successive phase measurements of said predetermined plurality of cycles, and
means responsive to said first signal and coupled to said means for dividing, for inhibiting the producton of said second output signal for the first 180° of phase of said first signal during only the first cycle of said first signal during said plurality of successive cycles, whereby phase differences less than 180° have 360° added thereto for every cycle of said plurality of cycles

* * * * *